United States Patent
Ching et al.

(10) Patent No.: US 9,153,327 B2
(45) Date of Patent: *Oct. 6, 2015

(54) FLASH MEMORY APPARATUS WITH VOLTAGE BOOST CIRCUIT

(71) Applicant: eMemory Technology Inc., Hsinchu (TW)

(72) Inventors: Wen-Hao Ching, Hsinchu County (TW); Shih-Chen Wang, Taipei (TW)

(73) Assignee: eMemory Technology Inc., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/180,373

(22) Filed: Feb. 14, 2014

(65) Prior Publication Data
US 2014/0160859 A1   Jun. 12, 2014

Related U.S. Application Data

(63) Continuation-in-part of application No. 13/344,621, filed on Jan. 6, 2012, now Pat. No. 8,705,289.

(60) Provisional application No. 61/513,678, filed on Aug. 1, 2011.

(51) Int. Cl.
| | |
|---|---|
| *G11C 16/06* | (2006.01) |
| *G11C 16/10* | (2006.01) |
| *G11C 16/12* | (2006.01) |
| *G11C 16/04* | (2006.01) |

(52) U.S. Cl.
CPC ............ *G11C 16/10* (2013.01); *G11C 16/0441* (2013.01); *G11C 16/12* (2013.01)

(58) Field of Classification Search
CPC ......... G11C 16/08; G11C 16/12; G11C 6/107

USPC ............... 365/185.25, 185.18, 185.28, 182
See application file for complete search history.

(56) References Cited

U.S. PATENT DOCUMENTS

| | | | |
|---|---|---|---|
| 5,774,392 A | 6/1998 | Kraus et al. | |
| 5,973,979 A * | 10/1999 | Chang et al. | ................... 365/226 |
| 7,057,949 B1 * | 6/2006 | Pan et al. | ....................... 365/203 |
| 7,508,703 B2 | 3/2009 | Mokhlesi | |
| 7,508,710 B2 | 3/2009 | Mokhlesi | |
| 8,705,289 B2 * | 4/2014 | Yang et al. | ............... 365/185.25 |

(Continued)

FOREIGN PATENT DOCUMENTS

| | | |
|---|---|---|
| JP | H01-282796 | 11/1989 |
| JP | H10-334678 | 12/1998 |

(Continued)

*Primary Examiner* — Connie Yoha
(74) *Attorney, Agent, or Firm* — Jianq Chyun IP Office

(57) ABSTRACT

A flash memory apparatus is provided. The flash memory apparatus includes a plurality of memory cell regions. Each of the memory cell regions includes a plurality of memory cells, a programming voltage control generator and an erase voltage control generator. The memory cells receives a programming control voltage through a control end point for programming operation, and the memory cells receives an erase control voltage through an erase end point for erasing operation. The programming voltage control generator provides the programming control voltage to the memory cells, and the erase voltage control generator provides the erase control voltage to the memory cells.

22 Claims, 8 Drawing Sheets

(56) References Cited

U.S. PATENT DOCUMENTS

2004/0240269 A1* 12/2004 Cernea .................... 365/185.12
2008/0111532 A1 5/2008 Tran et al.
2008/0266944 A1 10/2008 Chen et al.
2012/0134228 A1 5/2012 Yu et al.

FOREIGN PATENT DOCUMENTS

| JP | 2000-057793 | 2/2000 |
| JP | 2008-112507 | 5/2008 |
| JP | 2009-117018 | 5/2009 |
| JP | 2011-018443 | 1/2011 |

* cited by examiner

FLASH MEMORY APPARATUS WITH VOLTAGE BOOST CIRCUIT

CROSS-REFERENCE TO RELATED APPLICATION

This application is a continuation-in-part application of and claims the priority benefit of a prior application Ser. No. 13/344,621, filed on Jan. 6, 2012, now pending. The prior application Ser. No. 13/344,621 claims the priority benefit of U.S. provisional application Ser. No. 61/513,678, filed on Aug. 1, 2011. The entirety of each of the above-mentioned patent applications is hereby incorporated by reference herein and made a part of this specification.

BACKGROUND OF THE INVENTION

1. Field of the Invention

The invention generally relates to a flash memory apparatus, in particular, to a flash memory apparatus with a voltage boost circuit.

2. Description of Related Art

Nowadays, memories could be classified into volatile memories and non-volatile memories. A volatile memory, for example, a dynamic random access memory (DRAM) has an advantage of fast programming and reading. Nevertheless, the volatile memory only operates when power is applied to the flash memory. On the other hand, although a non-volatile memory e.g. a flash memory operates slowly while programming and reading, the flash memory retains information inside for a long time even when there is no power applied to the flash memory.

Generally for operation of a flash memory, while programming or erasing, a specific voltage is required for injecting charges into the floating gate of the flash memory or drawing charges out of the floating gate of the flash memory. Therefore, a charge-pump circuit or a voltage generation circuit is usually needed for operating the flash memory. Hence, the voltage generation circuit of the flash memory circuit plays an important role in the operation of the flash memory.

SUMMARY OF THE INVENTION

Accordingly, the present invention is directed to a flash memory apparatus, and further to a flash memory with low operation voltage and low power consumption.

The present invention provided a flash memory apparatus. The flash memory apparatus includes a plurality of memory cell regions. Each of the memory cell regions includes a plurality of memory cells, a programming control voltage generator, and an erasing control voltage generator. Each of memory cells receives a programming control voltage through a control end point, and receives an erasing control voltage through an erase end point. The programming control voltage generator includes a pre-charge voltage transmitter and a pumping capacitor. The pre-charge voltage transmitter is coupled to all the control end points of the memory cells in the memory cell region. The pumping capacitor is coupled between the control end point of the memory cells and a pumping voltage. The pre-charge voltage transmitter applies the pre-charge voltage to the control end point of the memory cells according to a pre-charge enable signal during a first period of time. The pumping voltage is applied to the pumping capacitor during a second period of time, and generates the control voltage for programming at the control end points of the memory cells. The erasing control voltage generator includes an erasing pre-charge voltage transmitter and an erasing pumping capacitor. The erasing pre-charge voltage transmitter is coupled to all the erase end points of the memory cells in the memory cell region. The erasing pumping capacitor is coupled between the erase end point of the memory cells and an erasing pumping voltage. The erasing pre-charge voltage transmitter applies an erasing pre-charge voltage to the erase end point of the memory cells according to an erasing pre-charge enable signal during a third period of time. The erasing pumping voltage is applied to the erasing pumping capacitor during a fourth period of time, and generates an erasing control voltage for erasing at the erase end points of the memory cells.

The present invention provided another flash memory apparatus. The flash memory apparatus includes a plurality of memory cell regions. Each of the memory cell regions includes a plurality of memory cells, a plurality of programming control voltage generators, and an erasing control voltage generator. Each of memory cells receives a programming control voltage through a control end point, and receives an erasing control voltage through an erase end. Each of the programming control voltage generators includes a pre-charge voltage transmitter and a pumping capacitor. The pre-charge voltage transmitter is coupled to the control end point of the corresponding memory cell. The pre-charge voltage transmitter applies the pre-charge voltage to the control end point of the corresponding memory cell according to a pre-charge enable signal during a first period of time. The pumping capacitor is coupled between the control end point of the corresponding memory cell and a pumping voltage. The pumping voltage is applied to the pumping capacitor during a second period of time, and generates the programming control voltage for programming at the control end points of the corresponding memory cell. The erasing control voltage generator includes an erasing pre-charge voltage transmitter and an erasing pumping capacitor. The erasing pre-charge voltage transmitter is coupled to all the erase end points of the memory cells. The erasing pumping capacitor is coupled between the erase end point of the memory cells and an erasing pumping voltage. The erasing pre-charge voltage transmitter applies an erasing pre-charge voltage to the erase end point of the memory cells according to an erasing pre-charge enable signal during a third period of time. The erasing pumping voltage is applied to the erasing pumping capacitor during a fourth period of time, and generates an erasing control voltage for erasing at the erase end points of the memory cells.

As described above, the present invention provides a flash memory apparatus. The flash memory apparatus transmits outside pre-charge voltages to the control or erase end points of the memory cells through pre-charge voltage transmitters, and boosts the pre-charge voltages received by the control or erase end points of the memory cells to the programming or erasing control voltages for operating the flash memory apparatus. The pre-charge voltages applied from the exterior of the apparatus will be lowered and the power consumption that the exterior of the apparatus supplying the pre-charge voltages will be reduced.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
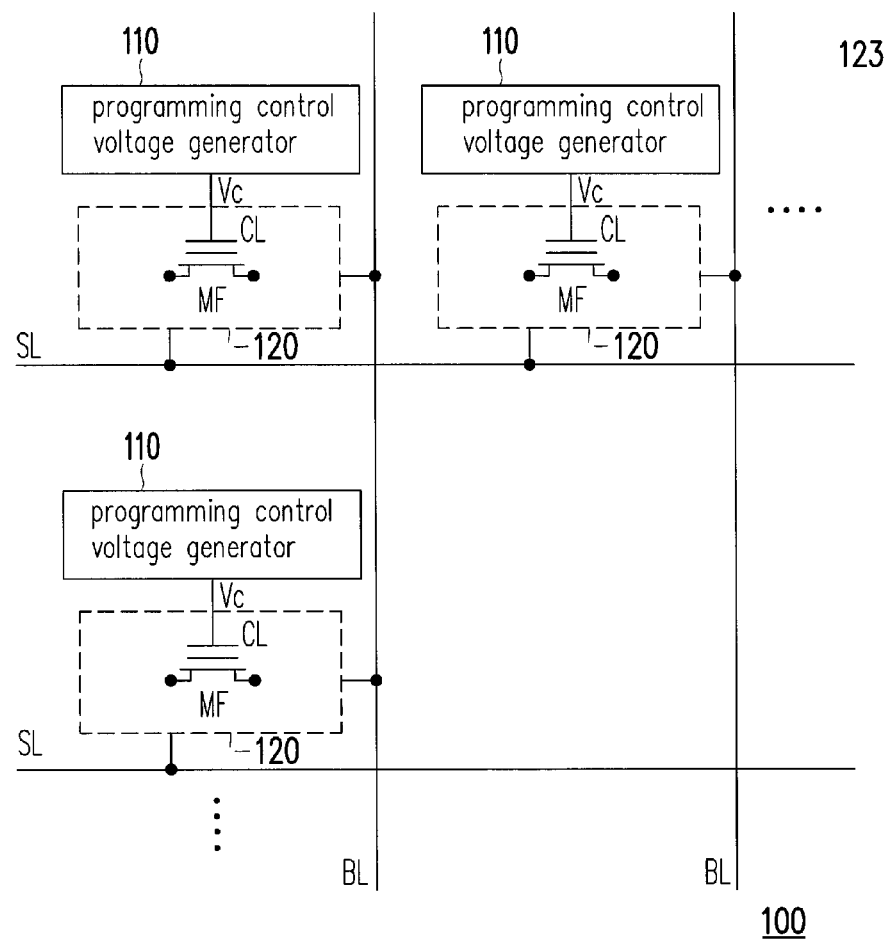
FIG. 1 shows a schematic view of the flash memory apparatus according to an embodiment of the invention.

Reference will now be made in detail to the present embodiments of the invention, examples of which are illustrated in the accompanying drawings. Wherever possible, the same reference numbers are used in the drawings and the description to refer to the same or like parts.

Figure 2A:
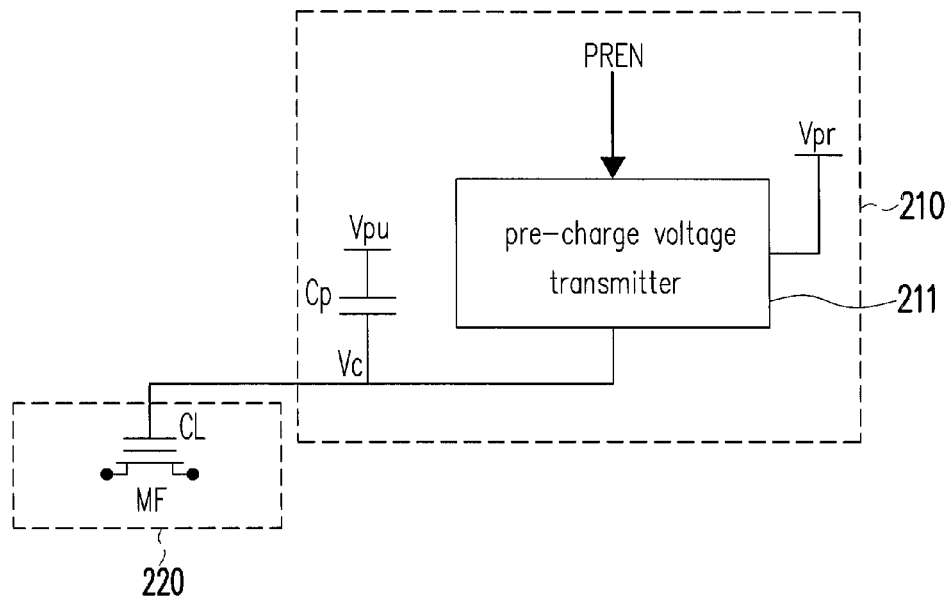
FIG. 2A shows a schematic view of the programming control voltage generator 210.

FIG. 1 shows a schematic view of a flash memory apparatus 100 according to an embodiment of the invention. Please refer to FIG. 1. The flash memory apparatus 100 includes a plurality of memory cells 120 and a plurality of programming control voltage generators 110. The memory cells 120 are arranged in order of array, and the programming control voltage generators 110 are respectively coupled to control end points CL of the memory cells 120. Generally speaking, the memory cells 120 of the flash memory apparatus 100 include MF, such as stacked-gate floating-gate transistors, single-poly floating-gate transistors or dielectric storage transistors. The two ends of each of the memory cells 120 are respectively coupled to a source line SL and a bit line BL. The memory cells 120 receive programming control voltages Vc generated by the programming control voltage generators 110 respectively to execute data programming operation through the control end points CL thereof FIG. 2A shows a schematic view of the programming control voltage generator 210. In FIG. 2A, the programming control voltage generator 210 includes a pre-charge voltage transmitter 211 and a pumping capacitor Cp. Wherein, the pre-charge voltage transmitter 211 is coupled to the control end point CL of the corresponding memory cell 220. About the operation of the pre-charge voltage transmitter 211, firstly, a pre-charge enable signal PREN is applied to the pre-charge voltage transmitter 211 in a first period of time, and the pre-charge voltage transmitter 211 is turned on correspondingly. Meanwhile, a pre-charge voltage Vpr is applied to the control end point CL of the corresponding memory cell 220 through the turned-on pre-charge voltage transmitter 211. In the mean time, the value of the programming control voltage Vc is approximately equal to the value of the pre-charge voltage Vpr. On the other hand, a pumping capacitor Cp is coupled between the control end point CL of the corresponding memory cell 220 and a pumping voltage Vpu. After the first period of time, the pumping voltage Vpu is applied to the end of the pumping capacitor Cp which is not coupled to the end of the pre-charge voltage transmitter 211 during a second period of time. Thus, the programming control voltage Vc is boosted at the control end point CL of the corresponding memory cell 220. Practically, the value of the programming control voltage Vc is approximately equal to the sum of the value of the pumping voltage Vpu and the value of pre-charge voltage Vpr.

Figure 2B:
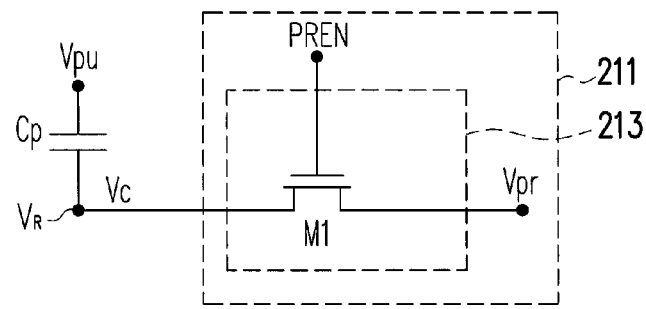
FIG. 2B shows a schematic view of the implementation of the pre-charge voltage transmitter 211 according to an embodiment of the invention.

Then, please refer to FIG. 2B. FIG. 2B shows a schematic view of the implementation of the pre-charge voltage transmitter 211 according to an embodiment of the invention. In this embodiment, the pre-charge voltage transmitter 211 includes a pre-charge programming switch 213 which is constructed of a transistor M1. The pre-charge programming switch 213 has a first end, a second end, and a control end. The first end of the pre-charge programming switch 213 is coupled to the control end point CL of the corresponding memory cell 220, and the second end of the pre-charge programming switch 213 receives the pre-charge voltage Vpr, and the control end of the pre-charge programming switch 213 receives the pre-charge enable signal PREN.

Figure 2C:
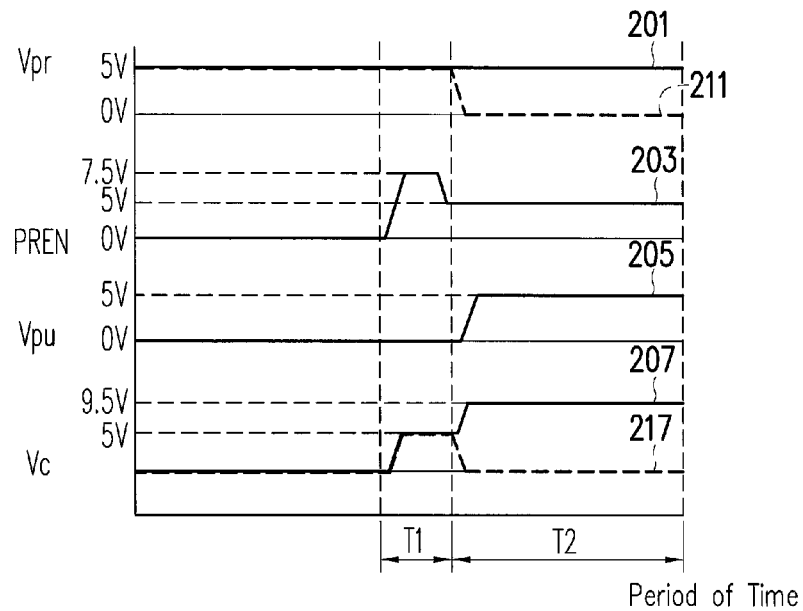
FIG. 2C shows an application waveform according to an embodiment of the invention.

For the further explanation, please refer to FIG. 2B and FIG. 2C. FIG. 2C shows an application waveform according to an embodiment of the invention. In this embodiment, the application waveform describes how the plurality of programming control voltage generators 210 execute a selective data programming and data erasing operation in the same time. When charging the control end point CL, please refer to the curves 201, 203, 205 and 207 in FIG. 2C. During a period of time T1, the second end of the transistor M1 receives the pre-charge voltage Vpr e.g. 5 Volts (curve 201). Besides, the pre-charge enable signal PREN received by the control end of the transistor M1 is biased to e.g. 7.5 volts (curve 203) and the transistor M1 is turned on correspondingly. At this time, the initial value of the pumping voltage Vpu is e.g. 0 volts (curve 205) and the pre-charge voltage Vpr is transmitted to the control end point CL of the corresponding memory cell 220, and the value of the programming control voltage Vc is equal to the value of pre-charge voltage Vpr (curve 207). Then, during a period of time T2, the pumping voltage Vpu is biased to e.g. 5 volts (curve 205) and the programming control voltage Vc is boosted to the value e.g. 9.5 volts (curve 207) which is approximately equal to the sum of the pre-charge voltage Vpr and the pumping voltage Vpu. Then, the memory cell 220 can be executed data programming operation.

According to another embodiment of the invention, when discharging the control end point CL, please refer to the curves 203, 205, 211 and 217. In this embodiment, the pre-charge enable signal PREN and the pumping voltage Vpu behave the same as the curve 203 and 205 of the embodiment as described above. Besides, during the period of time T1, transistor M1 receives the pre-charge voltage Vpr e.g. 5 Volts (curve 211) and the value of the programming control voltage Vc is equal to the value of pre-charge voltage Vpr (curve 217). During the period of time T2, the pre-charge voltage Vpr is driven down to e.g. 0 volts (curve 211) and the programming control voltage Vc discharged to e.g. 0 volts (curve 217). Then, the memory cell 120 may be executed data erasing operation.

It is noteworthy that the level of the pre-charge enable signal PREN may be driven down a bit to the value of the pre-charge voltage before entering the period T2, for example, from 7.5 volts to 5 volts (curve 203). At this time, the transistor M1 is cut-off, regarded as a diode, and the diode is reverse biased between the pre-charge voltage Vpr and the programming control voltage Vc. Such as that, when the programming control voltage Vc is boosted during the period T2, the pre-charge voltage Vpr does not effect the boost of the programming control voltage Vc.

Figure 3A:
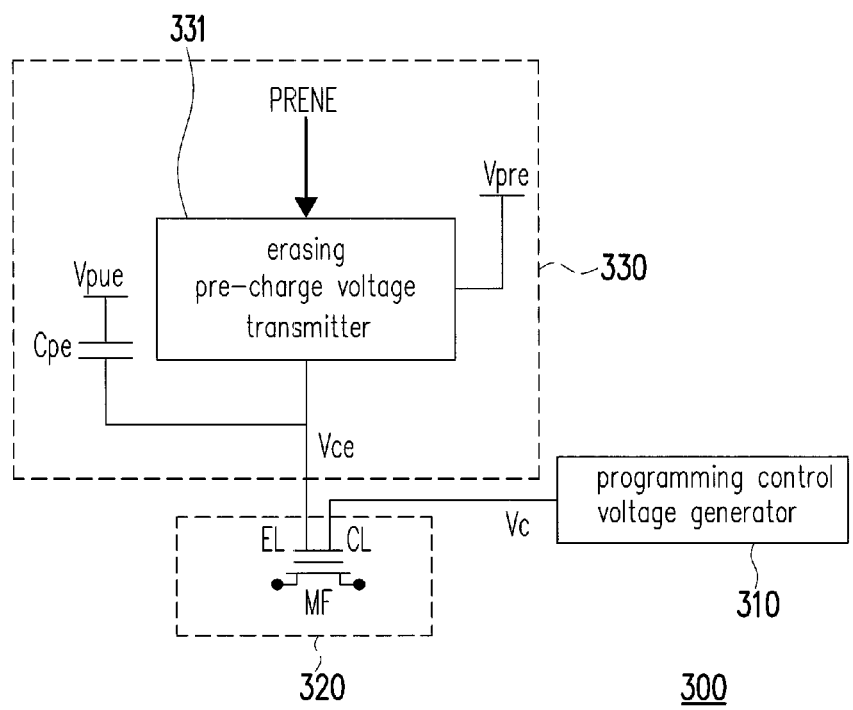
FIG. 3A shows another partial schematic view of a flash memory apparatus 300 according to an embodiment of the invention.

FIG. 3A shows another partial schematic view of a flash memory apparatus 300 according to an embodiment of the invention. Please refer to FIG. 3A. In addition to data programming operation, the flash memory apparatus 300 also requires a voltage generation circuit to perform a data erasing operation. Therefore, in the flash memory apparatus 300 of the embodiment, an erase end point EL is coupled to an erasing control voltage generator 330, and an erasing pre-charge voltage Vpre is transmitted to the erase end point EL of a memory cell 320 according to an erasing pre-charge enable signal PRENE. Then, an erasing control voltage Vice for erasing is generated according to an erasing pumping voltage Vpue which is applied to an erasing pumping capacitor Cpe. Wherein, the memory cell 320 includes a MF, such as a stacked-gate floating-gate transistor, a single-poly floating-gate transistor or a dielectric storage transistor.

Figure 3B:
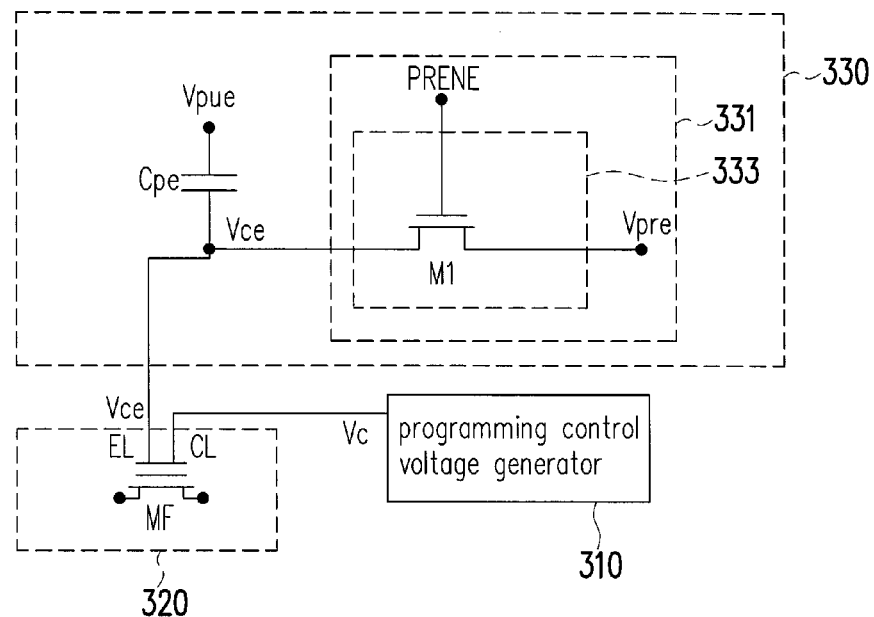
FIG. 3B shows a schematic view of an erasing pre-charge voltage transmitter 331 according to an embodiment of the invention.

FIG. 3B shows a schematic view of an erasing pre-charge voltage transmitter 331 according to an embodiment of the invention. Please refer to FIG. 3B. The erasing pre-charge voltage transmitter 331 includes an erasing pre-charge switch 333. In this embodiment, the erasing pre-charge switch 333 may be a transistor M1 which is coupled between the erasing pre-charge voltage Vpre and the erase end point EL of the corresponding memory cell 320, and the transistor M1 is turned on according to the erasing pre-charge enable signal PRENE.

Figure 3C:
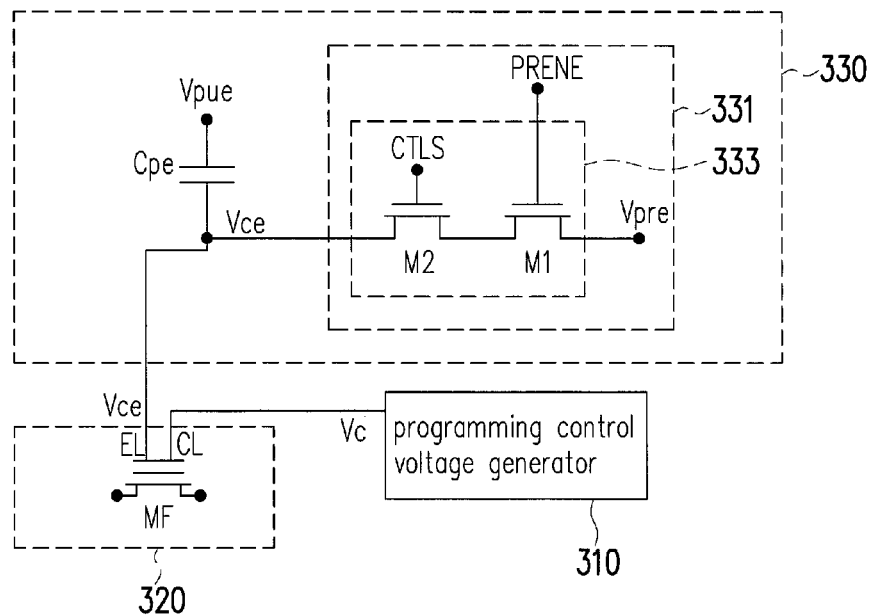
FIG. 3C shows another implementation of the erasing pre-charge voltage transmitter 331 includes the erasing pre-charge switch 333 according to an embodiment of the invention.

FIG. 3C shows another implementation of the erasing pre-charge voltage transmitter 331 includes the erasing pre-charge switch 333 according to an embodiment of the invention. Please refer to FIG. 3C. the erasing pre-charge switch 333 also may be two transistors M1 and M2 which are coupled in series between the erasing pre-charge voltage Vpre and the erase end point EL of corresponding the memory cell 320, and the transistor M1 and the transistor M2 are enabled according to an erasing pre-charge enable signal PRENE and a control signal CTLS, respectively.

Figure 3D:
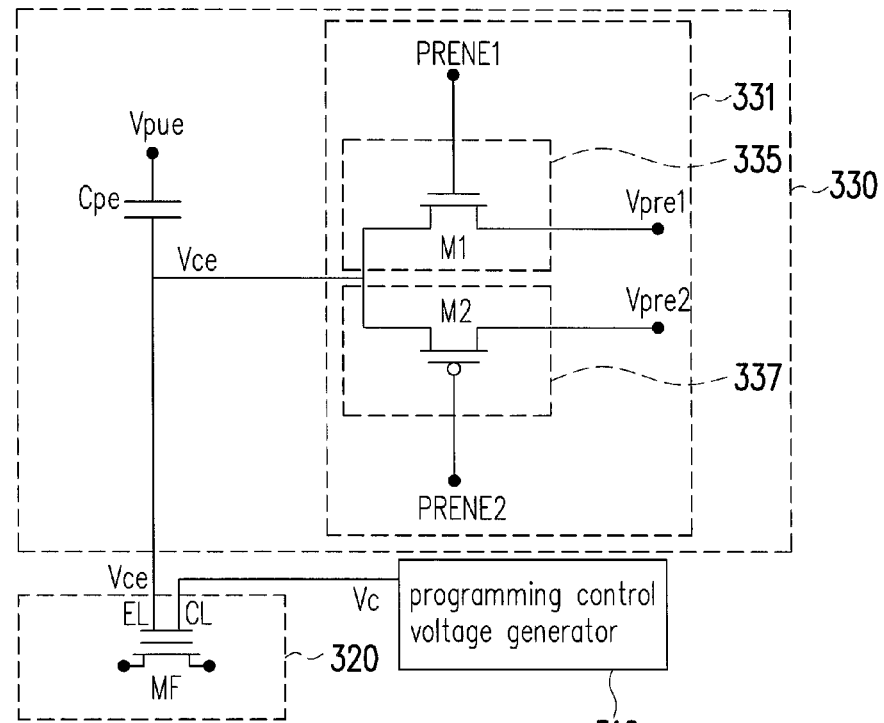
FIG. 3D shows another implementation of the erasing pre-charge voltage transmitter 331 according to an embodiment of the invention.

FIG. 3D shows another implementation of the erasing pre-charge voltage transmitter 331 according to an embodiment of the invention. Please refer to FIG. 3D, the erasing pre-charge voltage transmitter 331 includes erasing pre-charge switches 335 and 337. The erasing pre-charge switches 335 and 337 may be transistors M1 and M2 which are respectively coupled between a first erasing pre-charge voltage Vpre1 and the erase end point EL of the corresponding memory cell 320, and between a second erasing pre-charge voltage Vpre2 and the erase end point EL of the corresponding memory cell 320. The erasing pre-charge switches 335 and 337 are operated respectively by applying a first erasing pre-charge enable signal PRENE1 to the transistor M1 or by applying a second erasing pre-charge enable signal PRENE2 to the transistor M2.

Figure 3E:
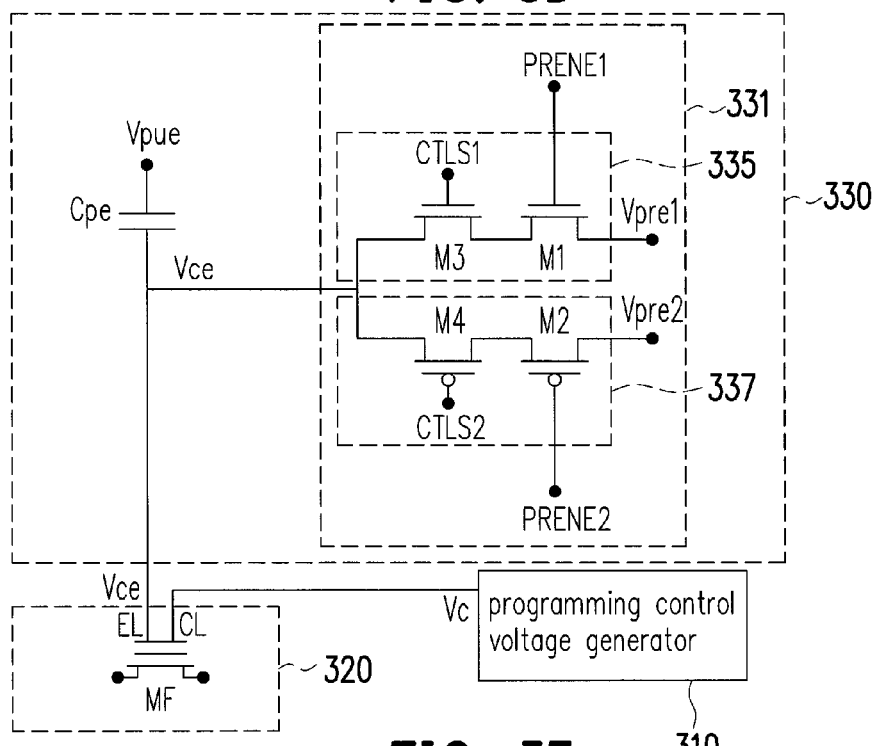
FIG. 3E shows another schematic view of the erasing pre-charge voltage transmitter 331 includes erasing pre-charge switches 335 and 337 according to an embodiment of the invention.

FIG. 3E shows another schematic view of the erasing pre-charge voltage transmitter 331 includes erasing pre-charge switches 335 and 337 according to an embodiment of the invention. Please refer to FIG. 3E. The erasing pre-charge switches 335 and 337 could be implemented respectively through two serially coupled transistors. The erasing pre-charge switch 335 includes transistors M1 and M3 which are coupled in series between a first erasing pre-charge voltage Vpre1 and the erase end point EL of the corresponding memory cell 320, and the erasing pre-charge switch 337 includes transistors M2 and M4 which are coupled in series between a second erasing pre-charge voltage Vpre2 and the erase end point EL of the corresponding memory cell 320. Alternatively, the transistors M1 and M3 are turned on according to a first erasing pre-charge enable signal PRENE1 and a first erasing control signal CTLS1, or the transistors M2 and M4 are turned on according to a second erasing pre-charge enable signal PRENE2 and a second erasing control signal CTLS2. Through the process above, the erasing pre-charge switch 335 and the erasing pre-charge switch 337 are respectively operated.

Figure 4:
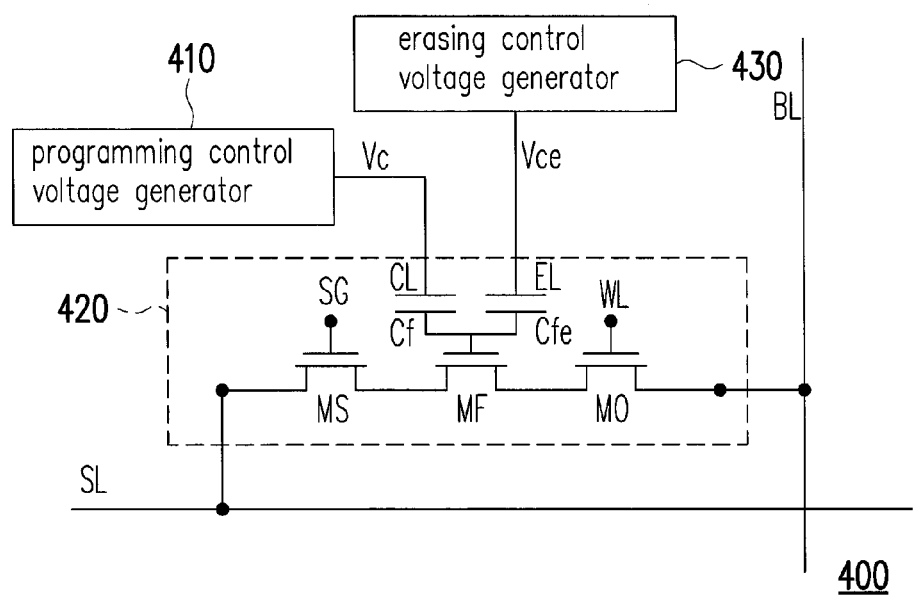
FIG. 4 shows another schematic view of a flash memory apparatus 400 according to an embodiment of the invention.

FIG. 4 shows another schematic view of a flash memory apparatus 400 according to an embodiment of the invention. Please refer to FIG. 4. The flash memory apparatus 400 includes a plurality of programming control voltage generator 410, a plurality of memory cells 420 and a plurality of erasing control voltage generators 430. More specifically, each of memory cells 420 coupled between a source line SL and a bit line BL includes a single-poly floating-gate transistor MF, a selecting transistor MS, an operation transistor MO, a gate capacitor Cf and a erase gate capacitor Cfe.

In the embodiment, the programming control voltage generator 410 provides the programming control voltages Vc to the gate capacitor Cf, and the erasing control voltage generator 330 provides the erasing control voltage Vce to the erase gate capacitor Cfe. The programming control voltage generator 410 may be as same as the programming control voltage generator 210 in FIG. 2B. The erasing control voltage generator 430 may be as same as one of the erasing control voltage generators 330 in FIG. 3B-FIG. 3E.

In addition, generally speaking, a block of memory cells could be operated at the same time while being erased. Therefore, the number of the erasing pre-charge voltage transmitters could be reduced through the design of one erasing pre-charge voltage transmitter integrated with a plurality of memory cells.

It is to be noted that the programming control voltage Vc provided to the control end point CL has a higher voltage level when the memory cell 420 is programmed, and the programming control voltage Vc provided to the control end point CL has a lower voltage level when the cell 420 is erased. On the other hand, the erasing control voltage Vce provided to the erase end point EL has a higher voltage level when the memory cell 420 is programmed or erased. That is, the programming control voltage Vc and the erasing control voltage Vce may be boosted during a same period of time when the memory cell 420 is programmed.

Figure 5:
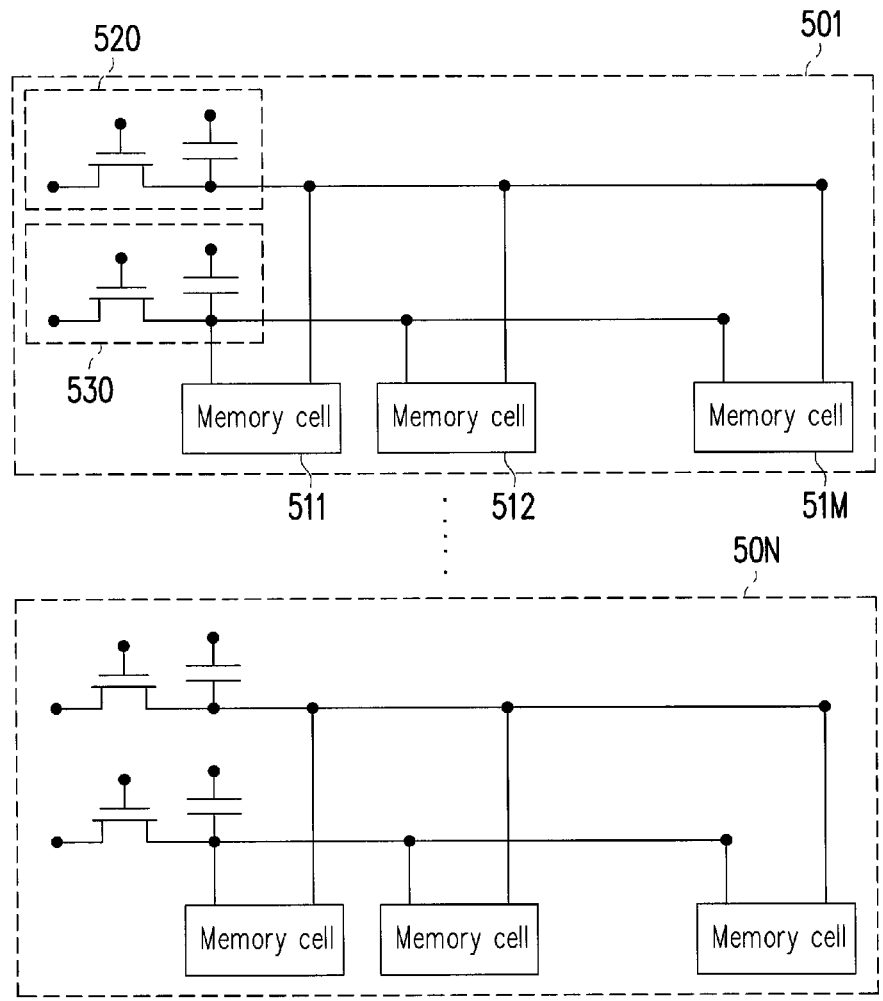
FIG. 5 shows further another schematic view of a flash memory apparatus 500 according to an embodiment of the invention.

Referring to FIG. 5, FIG. 5 shows further another schematic view of a flash memory apparatus 500 according to an embodiment of the invention. The flash memory apparatus 500 includes a plurality of memory cell regions 501~50N. Each of the memory cell regions 501~50N includes a plurality of memory cells, a programming control voltage generator, and an erase control voltage generator. For example, the memory cell region 501 includes memory cells 511~51M, a programming control voltage generator 520, and an erase control voltage generator 530.

The programming control voltage generator 520 may be implemented by the programming control voltage generator 210. The operation of the programming control voltage generator 210 is detailed described before, and no more description repeated here.

Please notice here, all of the memory cells 511~51M in the same memory cell region 501 are coupled to the programming control voltage generator 520. When one of the memory cells 511~51M is programmed, a plurality of unselected memory cells of the memory cells 511~51M are inhibited, and a selected memory cell of the memory cells 511~51M is not inhibited.

The erase control voltage generator 530 may be implemented by the erase control voltage generator 330. The operation of the erase control voltage generator 330 is detailed described before, and no more description repeated here.

All of the memory cells 511~51M in the same memory cell region 501 are coupled to the erasing control voltage generator 530. That is, all of the memory cells 511~51M in the same memory cell region 501 which are coupled to the erasing control voltage generator 530 may be erased at the same time.

Figure 6:
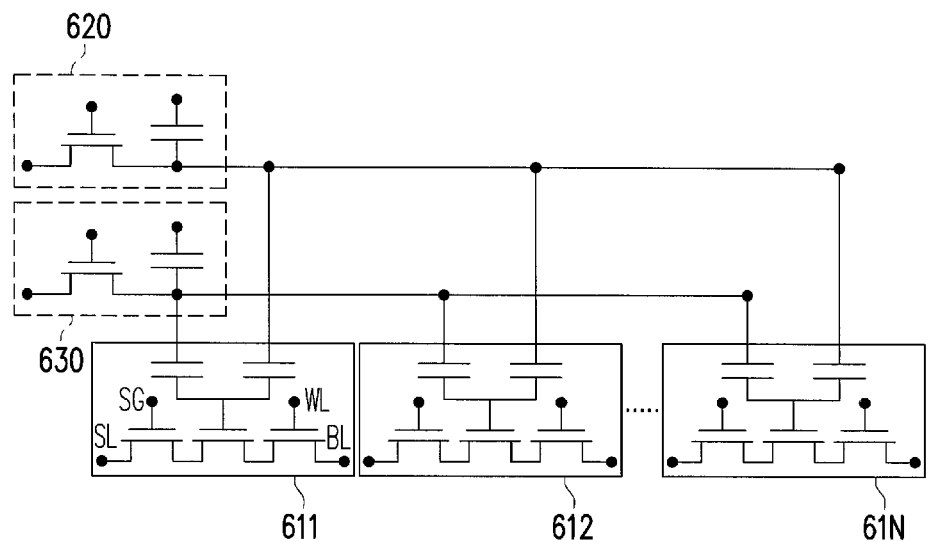
FIG. 6 shows a schematic view of a memory cell region 600 according to an embodiment of the invention.

Referring to FIG. 6, FIG. 6 shows a schematic view of a memory cell region 600 according to an embodiment of the invention. The memory cell region 600 includes a plurality of memory cells 611~61N, a programming control voltage generator 620, and an erase control voltage generator 630. The programming control voltage generator 620 and the erase control voltage generator 630 are respectively as same as the programming control voltage generator 520 and the erase control voltage generator 530. Each of the memory cells 611~61N may be implemented by the memory cell 420 in FIG. 4 or the memory cell 120 in FIG. 1.

For example, when one of the memory cells 612~61N is selected for programming, the memory cell 611 is inhibited. In this embodiment, a selecting gate, a selecting line, a word line and a bit line of the memory cell 611 may receive voltages with same voltage (for example 3.3V) for inhibiting the memory cell 611. In another embodiment, the selecting gate and the selecting line nay be applied by a voltage (3.3V or 0V), and the word line and the bit line may be applied by another voltage (0V or 3.3V) for inhibiting the memory cell 611. That is, a memory cell in the memory cells 612~61N may be inhibited or not inhibited for programming by controlling the voltage levels of the selecting gate, the selecting line, the word line and the bit line of the memory cell.

Figure 7:
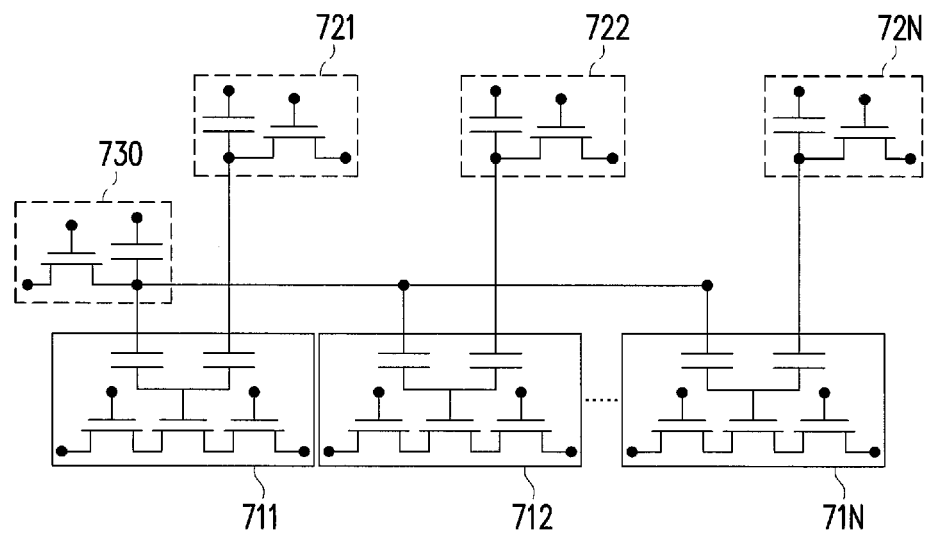
FIG. 7 shows another schematic view of a memory cell region 700 according to an embodiment of the invention.

Referring to FIG. 7, FIG. 7 shows another schematic view of a memory cell region 700 according to an embodiment of the invention. The memory cell region 700 includes a plurality of memory cells 711~71N, a plurality of programming control voltage generator 72F-72N, and an erase control voltage generator 730. The programming control voltage generator 721-72N are respectively coupled to the memory cells 711~71N, and the programming control voltage generator 721-72N respectively provide a plurality of the programming control voltages to the memory cells 711~71N for programming operation. That is, each of the memory cells 711~71N may be programmed individually. When each of the memory cells 711~71N is programmed, the corresponding programming control voltage generator may provide the programming control voltage to the programmed memory cell.

In summary, the present invention provides a flash memory apparatus. The applied voltage from the exterior of the apparatus is lowered according to the voltage boost operation of the flash memory apparatus so as to reduce the power consumption when the exterior of the apparatus supplying voltages. Moreover, the memory cells may share an erasing control voltage generator and/or a programming control voltage generator which results in that the area of the flash memory apparatus can be reduced. Additionally, a design of multiple input voltages is offered to enlarge the range of input voltages and the flash memory apparatus is fit to operate under different voltages.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A flash memory apparatus, comprising:
    a plurality of memory cell regions, wherein each of the memory cell regions comprises:
        a plurality of memory cells, wherein each of the memory cells receives a programming control voltage through a control end point, and receives an erasing control voltage through an erase end point;
        a programming control voltage generator, coupled to the memory cells, wherein the programming control voltage generator comprises:
            a pre-charge voltage transmitter, coupled to all the control end points of the memory cells, providing a pre-charge voltage to the control end point of the memory cells according to a pre-charge enable signal during a first period of time; and
            a pumping capacitor, coupled between the control end point of the memory cells and a pumping voltage which is applied to the pumping capacitor during a second period of time, generating the programming control voltage at the control end point of the memory cells; and
        an erasing control voltage generator, coupled to the memory cells, wherein the erasing control voltage generator comprises:
            an erasing pre-charge voltage transmitter, coupled to all the erase end points of the memory cells, providing an erasing pre-charge voltage to the erase end point of the memory cells according to an erasing pre-charge enable signal during a third period of time; and
            an erasing pumping capacitor, coupled between the erase end point of the memory cells and an erasing pumping voltage which is applied to the erasing pumping capacitor during a fourth period of time, generating the erasing control voltage for erasing.

2. The flash memory apparatus as claimed in claim 1, wherein the pre-charge voltage transmitter comprises:
    a pre-charge programming switch, coupled between the pre-charge voltage and the control end points of the memory cells, the pre-charge programming switch is turned on for transmitting the pre-charge voltage to the control end point according to the pre-charge enable signal.

3. The flash memory apparatus as claimed in claim 2, wherein the pre-charge programming switch comprises:
    a first transistor having a first end, a second end, and a control end, wherein the first end and the second end of the first transistor respectively coupled to the control end point of the corresponding memory cell and the pre-charge voltage, and the control end of the first transistor receiving the pre-charge enable signal.

4. The flash memory apparatus as claimed in claim 3, wherein the pre-charge programming switch further comprises:
    a second transistor, coupled on the path where the first transistor coupled to the control end point of the corresponding memory cell, having a first end, a second end, and a control end, wherein the first end of the second transistor coupled to the control end point of the corresponding memory cell, the second end of the second transistor coupled to the first end of the first transistor, and the control end of the second transistor receiving a control signal.

5. The flash memory apparatus as claimed in claim 1, wherein the pre-charge voltage transmitter comprises:
a first pre-charge programming switch, coupled between a first pre-charge voltage and the control end point of the corresponding memory cell; and
a second pre-charge programming switch, coupled between a second pre-charge voltage and the control end point of the corresponding memory cell,
wherein the first pre-charge programming switch and the second pre-charge programming switch are respectively controlled by a first pre-charge enable signal and a second pre-charge enable signal, and the first pre-charge programming switch transmitting the first pre-charge voltage to the control end point of the corresponding memory cell or the second pre-charge programming switch transmitting the second pre-charge voltage to the control end point of the corresponding memory cell.

6. The flash memory apparatus as claimed in claim 5, wherein the first pre-charge programming switch comprises:
a first transistor having a first end, a second end, and a control end, wherein the first end and the second end of the first transistor respectively coupled to the control end point of the corresponding memory cell and the first pre-charge voltage, and the control end of the first transistor receiving the first pre-charge enable signal; and
the second pre-charge programming switch comprises:
a second transistor having a first end, a second end and a control end, wherein the first end and the second end respectively coupled to the control end point of the corresponding memory cell and the second pre-charge voltage, and the control end of the second transistor receiving the second pre-charge enable signal.

7. The flash memory apparatus as claimed in claim 6, wherein the first pre-charge programming switch further comprises:
a third transistor, coupled on the path where the first transistor coupled to the control end point of the corresponding memory cell, having a first end, a second end, and a control end, wherein the first end of the third transistor coupled to the control end point of the corresponding memory cell, the second end of the third transistor coupled to the first end of the first transistor, and the control end of the third transistor receiving a first control signal; and
the second pre-charge programming switch further comprises:
a fourth transistor, coupled on the path where the second transistor coupled to the control end point of the corresponding memory cell, having a first end, a second end, and a control end, wherein the first end of the fourth transistor coupled to the control end point of the corresponding memory cell, the second end of the fourth transistor coupled to the first end of the second transistor, and the control end of the fourth transistor receiving a second control signal.

8. The flash memory apparatus as claimed in claim 7, wherein the second transistor and the fourth transistor are P-type transistors, and the first transistor and the third transistor are N-type transistors.

9. The flash memory apparatus as claimed in claim 1, wherein each of the memory cells comprises:
a floating-gate transistor.

10. The memory cell as claimed in claim 9, wherein the floating-gate transistor is fabricated by:
a single-poly CMOS process.

11. The flash memory apparatus as claimed in claim 1, wherein the memory cell comprises:
a dielectric storage transistor.

12. The flash memory apparatus as claimed in claim 1, wherein each of the memory cells coupled to a source line and a bit line comprises:
a storage transistor, having a first end, a second end, and a control end, wherein the first end of the storage transistor coupled to the source line, and the second end of the storage transistor coupled to the bit line;
a selecting transistor, coupled on the path where the source line coupled to the storage transistor, having a first end, a second end, and a control end, wherein the first end of the selecting transistor coupled to the source line, the second end of the selecting transistor coupled to first end of the storage transistor, and the control end of the selecting transistor receiving a selecting signal;
an operation transistor, coupled on the path where the bit line coupled to the storage transistor, having a first end, a second end, and a control end, wherein the first end of the operation transistor coupled to the second end of the storage transistor, the second end of the operation transistor coupled to the bit line, and the control end of the operation transistor receiving a word line enable signal; and
a gate capacitor, coupled between the programming control voltage and the control end of the storage transistor; and
an erase gate capacitor, coupled between an erase control voltage and an erase end point of the storage transistor.

13. The memory cell as claimed in claim 12, wherein the storage transistor is:
a floating-gate transistor.

14. The flash memory apparatus as claimed in claim 1, wherein the erasing pre-charge voltage transmitter comprises:
an erasing pre-charge switch, coupled between the erasing pre-charge voltage and an erase end point of the corresponding memory cell, which is turned on according to the erasing pre-charge enable signal for transmitting the erasing pre-charge voltage to the erase end point.

15. The flash memory apparatus as claimed in claim 14, wherein the erasing pre-charge switch comprises:
a first transistor having a first end, a second end, and a control end, wherein the first end and the second end of the first transistor respectively coupled to the erase end point of the corresponding memory cell and the erasing pre-charge voltage, and the control end of the first transistor receiving the erasing pre-charge enable signal.

16. The flash memory apparatus as claimed in claim 15, wherein the erasing pre-charge switch further comprises:
a second transistor, coupled on the path where the first transistor coupled to the erase end point of the corresponding memory cell, having a first end, a second end, and a control end, wherein the first end of the second transistor coupled to the erase end point of the corresponding memory cell, the second end of the second transistor coupled to the first end of the first transistor, and the control end of the second transistor receiving a control signal.

17. The flash memory apparatus as claimed in claim 1, wherein the erasing pre-charge voltage transmitter comprises:
a first erasing pre-charge switch, coupled between a first erasing pre-charge voltage and the erase end point of the corresponding memory cell; and
a second erasing pre-charge switch, coupled between a second erasing pre-charge voltage and the erase end point of the corresponding memory cell,
wherein the first erasing pre-charge switch and the second erasing pre-charge switch are respectively controlled by a first erasing pre-charge enable signal and a second erasing pre-charge enable signal, and transmitting the first erasing pre-charge voltage or the second erasing pre-charge voltage to the erase end point of the corresponding memory cell.

18. The flash memory apparatus as claimed in claim 17, wherein the first erasing pre-charge switch comprises:
a first transistor having a first end, a second end, and a control end, wherein the first end and the second end of the first transistor respectively coupled to the erase end point of the corresponding memory cell and the first erasing pre-charge voltage, and the control end of the first transistor receiving the first erasing pre-charge enable signal; and
the second erasing pre-charge switch comprises:
a second transistor having a first end, a second end, and a control end, wherein the first end and the second end of the second transistor respectively coupled to the erase end point of the corresponding memory cell and the second erasing pre-charge voltage, and the control end of the second transistor receiving the second erasing pre-charge enable signal.

19. The flash memory apparatus as claimed in claim 18, wherein the first erasing pre-charge switch further comprises:
a third transistor, coupled on the path where the first transistor coupled to the erase end point of the corresponding memory cell, having a first end, a second end, and a control end, wherein the first end of the third transistor coupled to the erase end point of the corresponding memory cell, the second end of the third transistor coupled to the first end of the first transistor, and the control end of the third transistor receiving a first erasing control signal; and
the second erasing pre-charge switch further comprises:
a fourth transistor, coupled on the path where the second transistor coupled to the erase end point of the corresponding memory cell, having a first end, a second end, and a control end, wherein the first end of the fourth transistor coupled to the erase end point of the corresponding memory cell, the second end of the fourth transistor coupled to the first end of the second transistor, and the control end of the fourth transistor receiving a second erasing control signal.

20. The flash memory apparatus as claimed in claim 19, wherein the second transistor and the fourth transistor are P-type transistors, and the first transistor and the third transistor are N-type transistors.

21. The flash memory apparatus as claimed in claim 1, wherein the third period of time is overlapped with at least one of the first and second periods of time, and the fourth period of time is overlapped with at least one of the first and second periods of time.

22. A flash memory apparatus, comprising:
a plurality of memory cell regions, wherein each of the memory cell regions comprises:
a plurality of memory cells, wherein each of the memory cells receives a programming control voltage through a control end point, and receives an erasing control voltage through an erase end point;
a plurality of programming control voltage generators, respectively coupled to the memory cells, wherein the each of the programming control voltage generator comprises:
a pre-charge voltage transmitter, coupled to the control end point of the corresponding memory cell, providing a pre-charge voltage to the control end point of the corresponding memory cell according to a pre-charge enable signal during a first period of time; and
a pumping capacitor, coupled between the control end point of the corresponding memory cell and a pumping voltage which is applied to the pumping capacitor during a second period of time, generating the programming control voltage at the control end point of the corresponding memory cell; and
an erasing control voltage generator, coupled to the memory cells, wherein the erasing control voltage generator comprises:
an erasing pre-charge voltage transmitter, coupled to all the erase end point of memory cells, providing an erasing pre-charge voltage to the erase end point of the memory cells according to an erasing pre-charge enable signal during a third period of time; and
an erasing pumping capacitor, coupled between the erase end point of the memory cells and an erasing pumping voltage which is applied to the erasing pumping capacitor during a fourth period of time, generating the erasing control voltage for erasing.

* * * * *